(12) United States Patent
Kelley (10) Patent No.: US 6,300,764 B1
(45) Date of Patent: Oct. 9, 2001

(54) APPARATUS AND METHOD FOR PERFORMING BUILT-IN TESTING OF A SQUIB FIRE NETWORK

(75) Inventor: H. Ray Kelley, Oviedo, FL (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

(21) Appl. No.: 09/134,376

(22) Filed: Aug. 14, 1998

(51) Int. Cl.$^7$ .............. F23Q 21/00; G01R 31/02; G08B 29/00
(52) U.S. Cl. .............. 324/502; 324/73.11; 102/217; 340/514
(58) Field of Search ............ 324/158.1, 73.1, 324/502; 340/945, 500, 514; 102/206, 217

(56) References Cited

U.S. PATENT DOCUMENTS

| | | | |
|---|---|---|---|
| 3,562,640 | 2/1971 | Wright et al. | 324/51 |
| 3,619,792 | 11/1971 | Capeci et al. | 328/130 |
| 3,892,182 | 7/1975 | Covarrubias et al. | 102/70.2 R |
| 4,825,151 | 4/1989 | Aspelin | 324/73 R |
| 5,034,686 | 7/1991 | Aspelin | 324/158 R |
| 5,414,347 | 5/1995 | Monk et al. | 324/73.1 |
| 5,614,896 | 3/1997 | Monk et al. | 340/945 |
| 5,621,326 | 4/1997 | Watanabe et al. | 324/502 |

Primary Examiner—Safet Metjahic
Assistant Examiner—J Kerveros
(74) Attorney, Agent, or Firm—Burns, Doane, Swecker & Mathis, L.L.P.

(57) ABSTRACT

The present invention is directed to a squib fire network including built-in testing which is able to safely and efficiently verify the proper operational status of the squib fire network. All squibs in a given squib fire network of a missile can be tested prior to launch, thereby improving the reliability of weapon deployment.

33 Claims, 9 Drawing Sheets

APPARATUS AND METHOD FOR PERFORMING BUILT-IN TESTING OF A SQUIB FIRE NETWORK

BACKGROUND OF INVENTION

1. Field of the Invention

The present invention generally relates to squib fire networks which include a built-in testing system, and a method to evaluate the operational status of, and to determine faults within, a squib fire network.

2. State of the Art

A squib fire network includes at least one squib, a squib being an explosive device that comprises resistive elements, such as bridge wires. The bridge wires can be surrounded by explosive charges. When the resistive elements are charged through the passage of current, they detonate the explosive charges which explode and create a pressure wave that can be used to operate valves, explode larger charges (for use in weapons) and move pistons, and so forth. Within a missile for example, the firing of twenty-five or more squibs can be required to deliver the missile to its intended target. For example, squibs can be used to activate batteries, deploy wings, close doors, start engines, and actuate fuel valves.

Authorities have been reluctant to test squibs installed in a device, for fear of activating the device in response to an unintended current. This is especially true for squibs used in military applications. For example, missiles can be held below a ship's deck in storage bunkers. The testing of the electronics of these missiles is quite dangerous. A broken switch could ignite the missile and cause an explosion. As such, military authorities have refrained from passing current through squibs to test their operability. In fact, this type of testing has been strictly forbidden, as closing any contacts that would normally be used to fire the squib during a detonation sequence of a missile presents too much potential danger.

For example, U.S. Pat. No. 3,892,182 describes a squib control circuit which has squib filaments connected in series with a relay winding. A small amount of current is applied to the squib filaments, which light a lamp assciated with the relay, indicating the squib is ready to fire. Although the current directly applied to the squib is normally not high enough to "fire" the squib, a transient surge or spike in the current could inadvertently fire the squib. Thus, restrictions imposed on the testing of squib fire networks have rendered this test routine inapplicable to weapons because of its susceptibility to inadvertent firings.

U.S. Pat. No. 3,619,792 discloses a self-test circuit for use in a weapons drop situation. This system reports a failure of a weapons release subsequent to a release sequence. Although partial testing of squibs is performed, there is no testing to ensure that a current through the squib will ignite the squib before the weapon is actually delivered to its target.

Typically, at most two switches are involved in closing a squib fire network to provide fire current to the squib. Two switches are normally used so that if one switch fails and allows current to the squib, the second switch will block the current and the squib will not be prematurely ignited. For example, U.S. Pat. No. 5,621,326 discloses a squib which can be used for an airbag placed in an automobile. This system has the squibs placed between an acceleration switch and a second switch on the output side of the squib. However, should either squib produce a shorted condition after its activation, then the remaining squib may be starved of current and be unable to be activated. Furthermore, this circuit is not able to selectively activate a squib. Because this circuit increases the possibility of switch failure and inadvertent squib fire, it is inappropriate for use in all military applications.

The restrictions imposed on the testing of squib fire networks used in weaponry have left the reliability of missiles employing these devices in question until the missiles are actually deployed. Accordingly, there is a need for a squib fire network having a cost effective, built-in testing system to detect faults with a high level of accuracy without the potential for actuating squibs of the squib fire network. If the built-in testing system could determine whether all the squibs are in proper working order prior to launch, repairs could be performed on the weapon before deploying it, thus reducing weapon malfunctions in the field, and the number of weapons that must be expended to accomplish the field objective.

SUMMARY OF THE INVENTION

The present invention is directed to a squib fire network including built-in testing which is able to safely and efficiently verify the proper operational status of the squib fire network. For example, all squibs in a squib fire network of a missile can be tested prior to launch, thereby improving the reliability of weapon deployment.

In accordance with exemplary embodiments, an apparatus for controlling a squib fire network is disclosed which comprises: at least one means for supplying a current to at least one squib of said squib fire network; means for selecting said at least one squib to fire; and means for testing the squib fire network, said means for testing further including: means for selectively gating said current to said at least one squib; and means to attenuate said current to a value insufficient to activate said at least one squib.

In accordance with another exemplary embodiment of the invention, a squib fire network is disclosed which comprises: at least one squib; and a first switch alternately connectable between an open condition and an output of a current source, wherein said first switch is in operative connection with at least one additional switch, said at least one additional switch being alternately connectable between an open condition and an output of said first switch, and wherein said at least one additional switch is in operative connection with said at least one squib; a third switch alternately connectable between an open condition and an output of said at least one squib, wherein said third switch is in operative connection with a return current line; and a processor operatively connected to selectively open and close each of said first switch, said at least one additional switch, and said third switch.

In alternate embodiments of the present invention, an apparatus for firing a squib is disclosed which comprises: a squib firing means, said squib firing means further including a plurality of squibs and a switch bank means; a current supply means for providing a current supply to said squib firing means; switching means for selectively interrupting said current supply to and from said squib firing means; and control means to control said switch means and said switch bank means to selectively provide said current supply to said squib firing means.

In other embodiments of the present invention, a method for testing and firing a squib fire network is disclosed which comprises the steps of: selecting at least one squib; supplying a first current to said at least one squib; testing said squib fire network by selectively gating said first current to said at least one squib and attenuating said current to a value insufficient to activate said at least one squib.

In yet other embodiments of the present invention, a method for testing operability of a squib fire network is disclosed which comprises the steps of: supplying a current to at least one squib of the squib fire network; and providing redundant attenuation of said current to a value insufficient to actuate said at least one squib in the presence of a single point failure in said squib fire network.

BRIEF DESCRIPTION OF THE DRAWINGS

Other objects and advantages of the present invention will become more apparent from the following detailed description of the preferred embodiments, when read in conjunction with the accompanying drawings wherein like elements have been represented by like reference numerals and wherein.

DETAILED DESCRIPTION OF THE INVENTION

The present invention is directed to a squib fire network having at least one squib, and to the testing of squib fire networks. To facilitate an understanding of the present invention, an exemplary embodiment will be described with reference to the squib fire network of a weapon. It will be appreciated, however, that practical applications of principles which underlie the invention are not limited to weaponry. Rather, the invention will find utility in any environment where it is desirable to ensure the proper firing of squibs. This invention, for example, can be used in applications, such as an automobile air bag system or the like.

Figure 1:
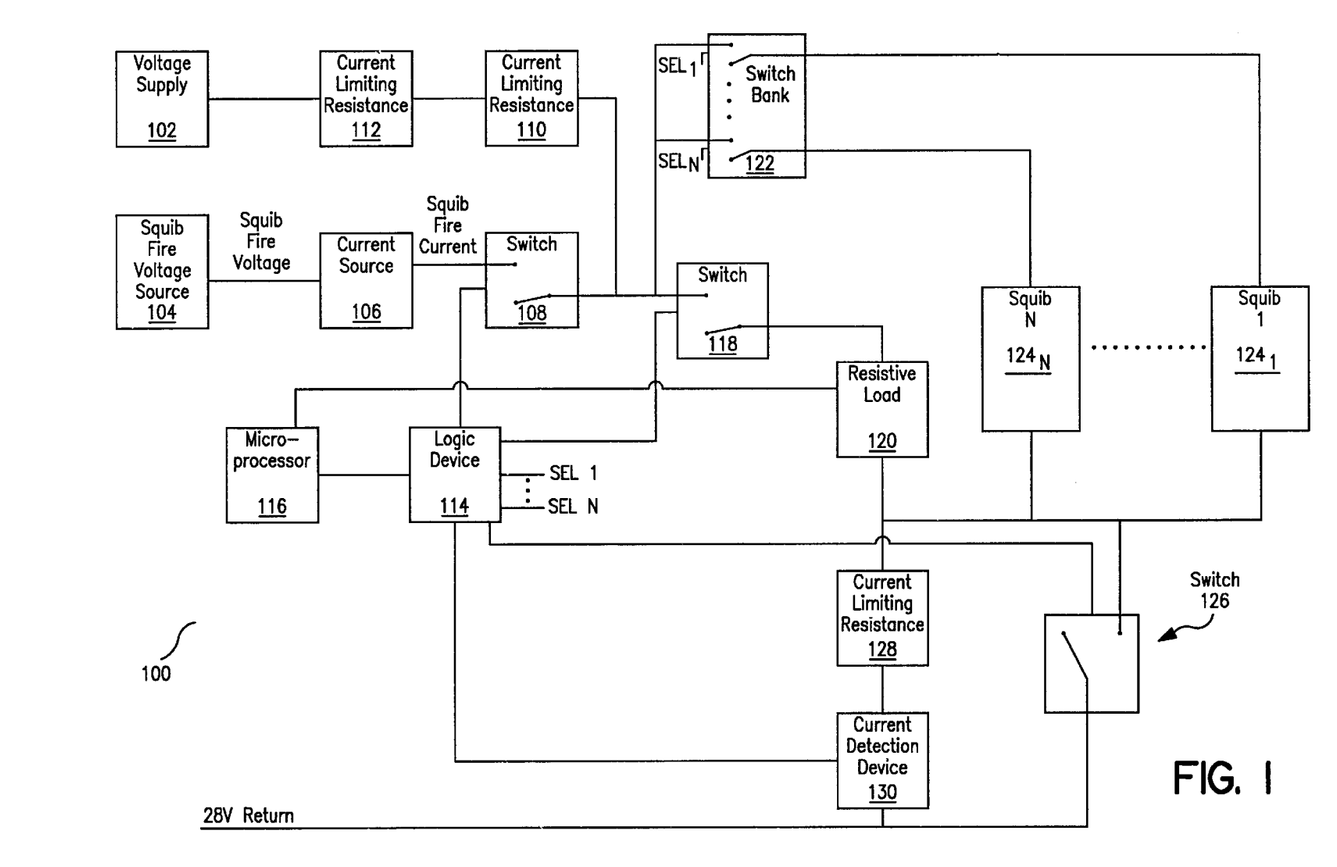
FIG. 1 illustrates a block diagram of a squib fire network in accordance with an exemplary embodiment of the present invention.

FIG. 1 illustrates an exemplary apparatus for controlling a squib included in a squib fire network 100, for a missile or the like. The squib fire network can, for example, be used in an aircraft. A voltage supply 102 (such as a 28 volt supply) powers-on the missile. Normally, this voltage supply is available on the aircraft where the missile and its associated squibs are located. However, it is also possible, if squibs are not being tested on an aircraft, to utilize a test cart having voltage supplies thereon.

An output of voltage supply 102 is connected with redundant attenuators, represented in FIG. 1 by two current limiting resistances 112 and 110, on the output side of the supply. The current limiting resistance 110, which can be one or more (e.g., two) individual resistors in series, limits the current (e.g., to milli-amps). The second current limiting resistance 112 can be placed between the current limiting resistance 110 and the first voltage supply 102. The small amount of current generated by the voltage supply 102 can be used to test the squib fire network without accidently firing the squibs.

The operational status of both of the current limiting resistances 110 and 112 can be determined through the use of a resistive load 120. If either of the current limiting resistances 110 and 112 has failed, the current measurable across resistive load 120 will yield different current levels based upon which current limiting resistance has failed. However, both of the current limiting resistances 110 and 112 are selected to sufficiently restrict the current to a safe level in the presence of the other resistor constituting a single point failure within the squib fire network (e.g., having a failed short). A single point failure is the failure of any one element of the squib fire network 100. For example, the individual failure of any switch can also represent a single point failure within the squib fire network.

A second voltage supply 104, or squib fire voltage source, supplies a squib fire voltage, which can vary from 15 to 82 volts, to the squib fire network 100. The output voltage of the second voltage supply 104 is used to fire a squib located in the squib fire network 100.

A current source 106 is placed on the output of the second voltage supply 104 to regulate current entering a switch 108. The squib fire current can, for example, be less than 9 amps and greater than 2 amps to properly fire a squib (e.g., approximately 4.0 A), or can be any desired amperage.

The switch 108 is a two position switch with a first contact connected to the current source 106, and a second open contact. Exemplary embodiments can employ, as a switching mechanism, a combination of opto-couplers and amplifiers in an integrated circuit. However, those skilled in the art will appreciate that any element which can perform the switching operation can be used.

The switch 108 is controlled by a logic device 114, such as a field-programmable-gate-array (FPGA) or application-specific-integrated-circuit (ASIC), which is controlled by a microprocessor 116, and used to gate the squib fire current output from the current source 106. The microprocessor 116 controls the test and/or tactical operation through the use of the logic device 114, which controls all switches in the squib fire network 100.

The output of the switch 108 is operably connected with a switch 118 and the output of the current limiting resistance 110. Because current from the voltage supply 102 has been limited by current limiting resistances 112 and 110, the voltage supply 102 adds only a very small amount of current to the squib fire current output by the current source 106 during normal operation. Switch 118 is also controlled by logic device 114 to switch between a first open contact and a second squib fire line.

The output of the second switch 118 is directly connected with a resistive load 120 which is used during testing to represent a squib. Those skilled in the art will appreciate that the load resistance 120 need not be a permanent element of the squib fire network. For example, a test cart can have a variable load resistor, that can be used as the resistive load 120 when the squib fire network 100 is being tested. Also, microprocessor 116 is able to detect the amount of current sent through the resistive load 120.

The switch 118 is connected in parallel with the switches of a switch bank 122. Each of the switches in the switch bank 122 is connected to a bank of squibs $124_1$ to $124_N$. In an alternate exemplary embodiment, the second switch 118 can be a switch within the switch bank 122 that is connected with the load resistance 120 instead of a squib.

Each squib $124_1$ to $124_N$ is configured using one or more (e.g., two) bridge wire circuits. The bridge wire circuit(s) include bridge wires surrounded by explosive charges. When the resistive elements of the bridge wires are charged through the passage of a predetermined amount of current, they detonate the explosive charges which explode to create a pressure wave that can be used to operate valves, explode larger charges, and/or move pistons and other mechanical elements.

The output sides of the squibs $124_1$ to $124_N$ are tied to a common node. A switch 126 is connected to this node in parallel with the series connection of a current limiting resistance 128 and a current detection device 130. Actuation of the switch 126 is controlled by the logic device 114. When the switch 126 is open, current, if present, will flow through the current limiting resistance 128 and the current detection device 130. The current, if present, is severely reduced by the current limiting resistor 128, and flows through the current detection device 130, which sends a signal to the logic device 114. When the switch 126 is closed, current will flow through the switch 126 and back through a return line to the voltage supply 102. The resistance of switch 126 is such that insufficient current will flow through current detection device 130 to detect current.

The embodiment shown in FIG. 1 can, for example, be expanded to include multiple switch banks. If another bank of switches is used, an additional pair of switches 108 and 126 can be used. In this case, as opposed to a single switch bank situation, multiple squibs can be fired at the same time.

Figure 2:
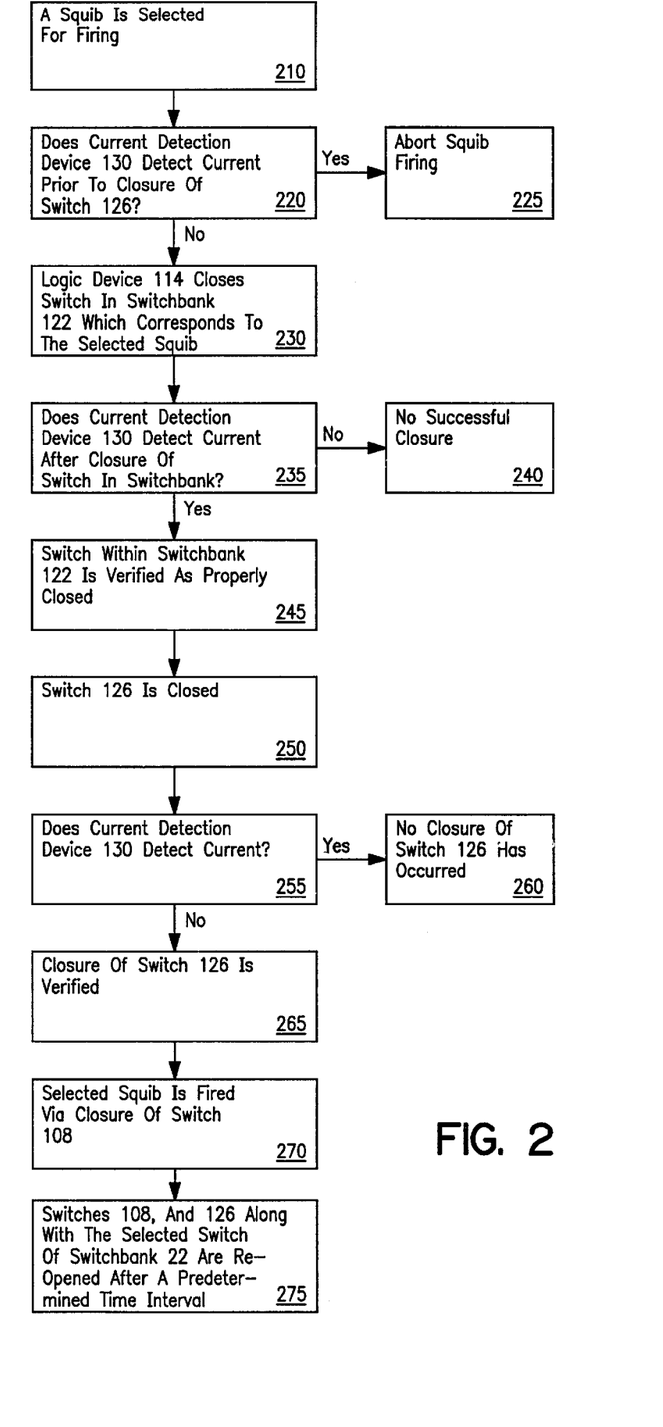
FIG. 2 illustrates a flow diagram of a squib firing process in accordance with an exemplary embodiment of the present invention.

An actual squib fire operation is shown in the flow diagram of FIG. 2. An actual squib fire operation includes a precheck operation of various components in the squib fire network that is separate and distinct from a built-in test operation of the entire squib fire network.

In step 210, a squib to be fired is selected by the FIG. 1 logic device 114 under control of the microprocessor 116. In step 220 of FIG. 2, the improper presence of current prior to closure of the FIG. 1 switch 126 is detected by the current detection device 130.

In step 225 of FIG. 2, if current is detected, the firing sequence is aborted, and an indication can be provided that the FIG. 1 switch 118 and/or one of the switches in switch bank 122 is faulty. The built-in test operation can be then used to indicate which switch has failed.

In step 230 of FIG. 2, the logic device 114 effects squib fire via closure of an appropriate select switch in switch bank 122. That is, if no current is detected at the current detection device 130, the appropriate select switch in the switch bank 122 is closed.

In step 235, after closure of a switch in the switch bank 122, if a current is detected by the current detection device 130, the switch has been properly closed. Otherwise, as shown in step 240, successful switch closure has not been achieved. The process can, at this point, abort or can continue at the discretion of the microprocessor 116. For example, if the failed switch in switch bank 122 is associated with a redundant squib bridge wire associated with a squib separately selected and detonated, the microprocessor can be programmed such that the actual squib fire operation will continue.

In step 250, after having verified correct operation of switch 118 and a given switch in switch bank 122 in step 245, switch 126 is closed on a command from the logic device 114. In step 255, the current detection device 130 is checked to verify that it does not detect any current. If no current is detected, then the switch 126 has been properly closed, as shown in step 265. Otherwise, switch 126 has not been properly closed, as shown in step 260.

In step 270, the selected squib is fired by momentarily closing switch 108 which permits a predetermined current (e.g., about 4.0 A) to run from the FIG. 1 current source 106 through the switch 108, through a given switch activated in the switch bank 122, through the selected squib, and then back through closed switch 126. This current ignites the selected squib in step 270. An alteration of switch selection in the switch bank 122 and an opening of switch 126 are inhibited during the closure of switch 108. Alternatively, step 270 can be performed prior to step 250 without changing the end results.

In step 275, switch 108 is re-opened by the logic device 114 following a predetermined time interval (e.g., a predetermined pulse). Following the predetermined time interval, switch 126 can also be opened and successful squib firing can be validated by an absence of current detected by the current detector 126. However, this is not an entirely accurate indicator in all cases because successful squib firing can, on occasion, result in an electrical short circuit condition at the squib instead of an open circuit condition.

Figure 3A:
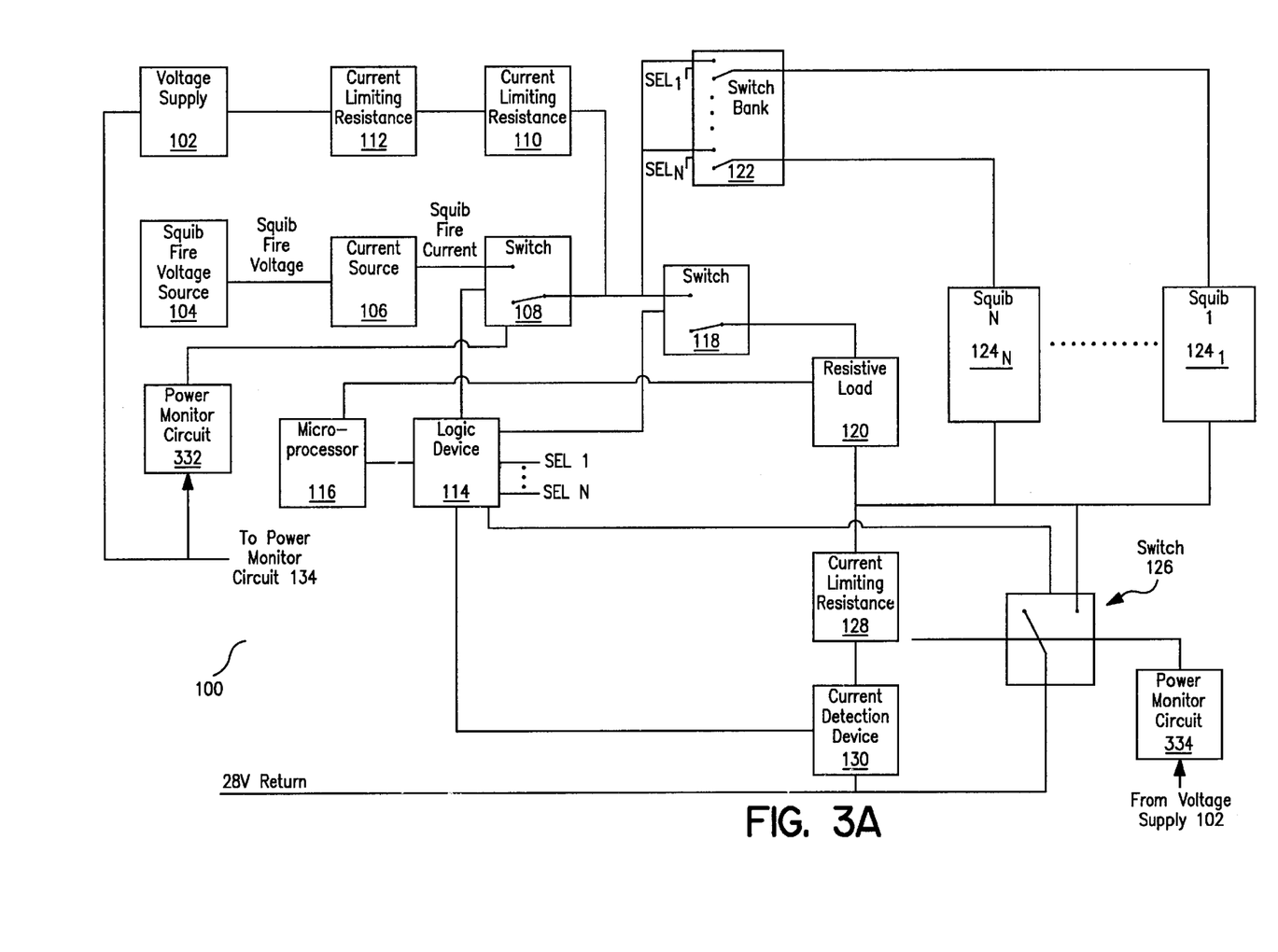
FIG. 3A illustrates a block diagram of a dual power monitoring system in a squib fire network in accordance with an exemplary embodiment of the present invention.

Another exemplary embodiment of the invention is illustrated in FIG. 3A as a block diagram of a dual redundant power monitoring system used in combination with the FIG. 1 squib fire network 100. Within the squib fire network 100, various voltages are required for proper network operation. In the FIG. 1 embodiment, the voltages are 5 V, 3.3V and 2.5V, which operate to control the logic device 114 and microprocessor 116. When the microprocessor 116 performs a squib fire sequence, it commands the logic device 114 to perform the proper switch closures. The microprocessor 116 can be any computer system including, but not limited to a Power PC™ available from International Business Machines (IBM), Inc. or Motorola Inc. The power PC™ can determine the sequence of squib firings.

A typical Power PC™ has a 3.3 V device and a 2.5 V internal logic core, although any microprocessor, having any specified voltage requirements can be used. Both of those voltages should be within 5 percent of the rated voltage, or any other specified tolerance, for the squib firing network to operate properly. In an exemplary embodiment, the logic device 114 is powered by a 5 V source which should be within 10 percent of its rated output for a squib to operate properly. The voltages used by the logic device 114 must be within their operable ranges to ensure proper operation.

Two power monitor circuits 332 and 334 are connected to switches 108 and 126, respectively. In addition to previously stated processes, both of those switches must be closed for a squib to fire. If, for example, a brown out situation were to occur (i.e., power available to the squib fire network is reduced), the logic device 114, which controls the switches, could erroneously attempt to close one or more of the switches 108, 118 and 126 when there is no actual command to do so. If the squib fire current were accidently sent through the squibs 124, the results could be disastrous.

Figure 3B:
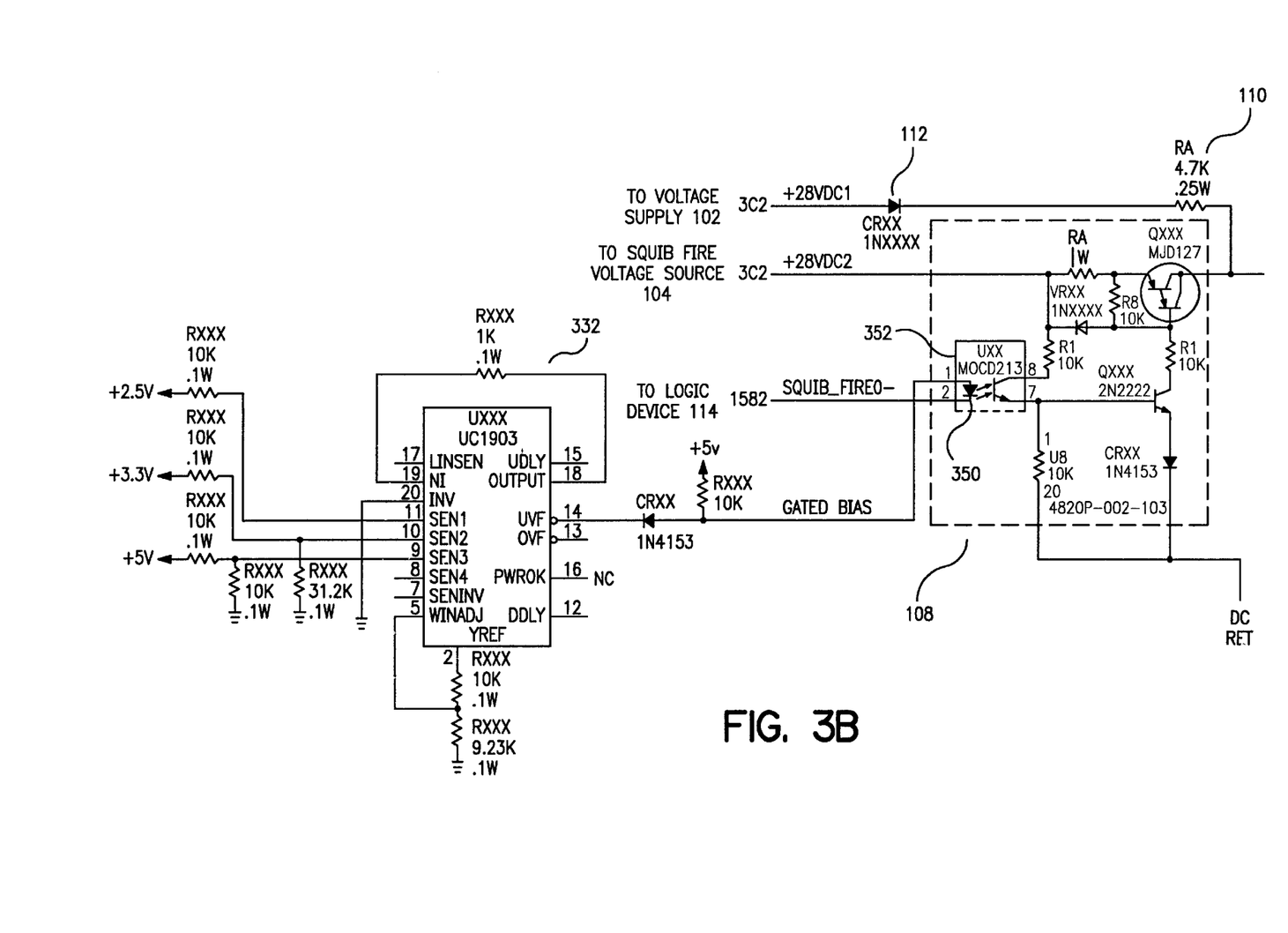
FIG. 3B illustrates a schematic illustration of a power monitor circuit utilized in a squib fire network in accordance with an exemplary embodiment of the present invention.

As illustrated schematically in FIG. 3B, the power monitor circuit 332 detects and monitors the voltages used by the FIG. 3A logic device 114 and microprocessor 116. If an out-of-tolerance voltage is sensed, either of the power monitor circuits 332 and 334 can effectively gate (i.e., shunt) current input from the logic device 114 into the switch 108. For example, the power monitor circuit 332 of FIG. 3B starves the anode of the diode 350 in the opto-coupler 352 of switch 108 so that no closure of the switch 108 occurs. As a result, a squib fire gate current cannot pass through the switch 108.

The second power monitor circuit 334 of FIG. 3A gates current into switch 126 in the same manner as discussed above with respect to the first power monitor circuit 332 of FIG. 3B. The second power monitor circuit 334 prevents the failure of a single power monitor circuit from risking the safety of the entire squib fire network. While adding slightly to the expense of the squib fire network, the fail safe precautions provide a safe squib fire environment.

The power monitor circuits shown in FIGS. 3A and 3B can be powered by the voltage supply 102, such that they are powered independent of regulated supplies. While in this exemplary embodiment the power monitor circuits 332 and 334 were shown controlling switches 108 and 126, it will be understood that, as long as two power monitor circuits are monitoring two of switches 108 or 126 or switch bank 122, dual redundancy has been provided.

Figure 4:
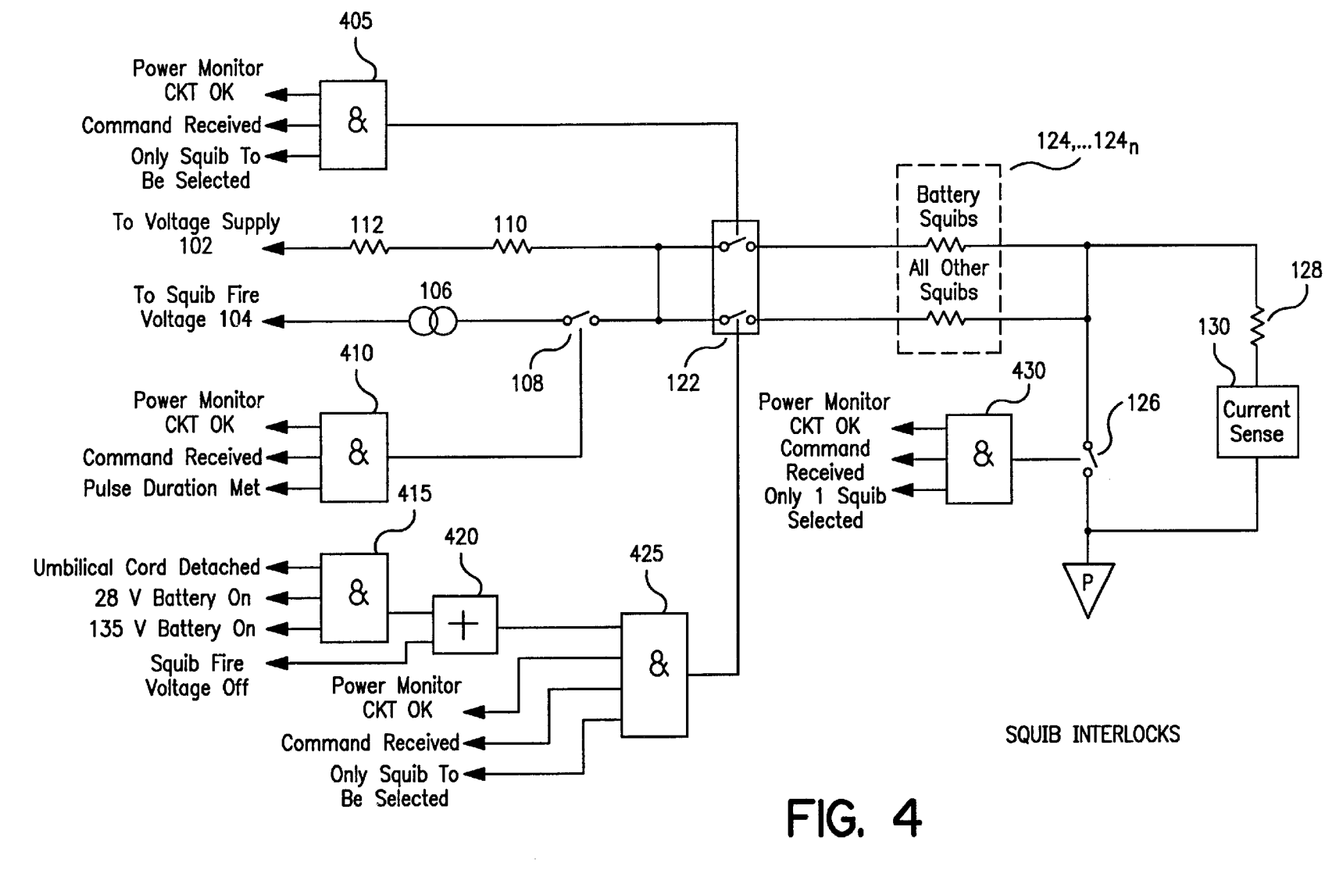
FIG. 4 illustrates a squib interlock in accordance with an exemplary embodiment of the present invention.

The predetermined time interval and the power monitor circuits 332 and 334, are part of an interlock system illustrated in FIG. 4. The interlock system provides further protection against unwanted switch closure and squib firing. When a switch in the switch bank 122 is to be closed to, for example, pop out wings or fire an engine of a missile, the interlock system requires certain conditions to be met before the switch in the switch bank 122 can be closed. Switches 108, 122 and 126 are shown in FIG. 4 along with various FIG. 1 components. Combinatorial blocks (e.g., analog or digital and gates) 405, 410, 415, 430, 425 and 415 represent the individual system requirements that must be met before closure of the switches can be enabled.

Block 405 represents conditions required for the closure of the switches of the switch bank 122 which are, for example, dedicated to battery squibs. While most squibs are to be fired with a stringent interlock system, certain squibs are allowed more simplified or more complex interlock systems. For example, squibs which fire to enable chemicals to be combined to form a battery are typically required to be fired before any other squibs. The battery can, for example, thereafter be used to provide firing current to the remaining squibs.

To fire the battery squibs, an exemplary embodiment is configured such that the power monitoring system must indicate that power throughout the system is within specified tolerance ranges. A command must then be issued from the microprocessor 116, and when a given squib switch is selected, it must be the only switch in the switch bank 122 selected. If all of these requirements are met, then the switch used to fire the selected battery squib will close.

For the remaining switches in the squib switch bank 122 and switch 118, the interlock requirements can be configured to be much more demanding, as shown by blocks 420 (a logical OR block), 425 and 415. Block 425 will enable a remaining switch of the switch bank 122 if the following exemplary requirements are met: the requirements of the battery squibs described above are met; the squib fire voltage is deactivated (if in built-in testing condition) or the squib fire voltage is activated, an umbilical (e.g., used to electrically attach to a host, such as an airframe) is severed; and batteries used to provide various voltages to the squib fire network (e.g., the supply voltage 102 and any other voltage supplies such as a 135V supply used to power elevons of the missile) are activated (if in a squib fire condition).

For switch 126, interlock 430 requires that the power monitor circuit 334 ensure that all operating voltages are within proper tolerance ranges, that only one squib is selected, and that a software command has been properly issued from microprocessor 116.

To enable switch 108, the interlock 410 requires that the power monitor circuit 332 ensure that all operating voltages are within proper tolerance ranges, that only one squib is selected, that a software command has been issued from microprocessor 116 and that the switch 108, when closed, is only closed for a predetermined time (e.g., 50 msec). Those skilled in the art will appreciate that the duration of closure of the switch 108 can be programmed to any length of time according to system specifications and user requirements and that this time duration could have been applied to switch 126 instead of switch 108.

To fire a squib, the switches 108 and 126, and a selected one of the switches in switch bank 122, must be closed. The requirements for closure of these switches are quite stringent, and do not allow for system error or transient errors to mistakenly fire a squib when the squib is not intended to be fired. It should be noted, however, that the interlocks can be reconfigured to be more or less demanding based upon the type of squib being fired. For example, if a squib fire network were employed for air bags within an automobile, the interlock requirements could be more or less stringent.

Figure 5A:
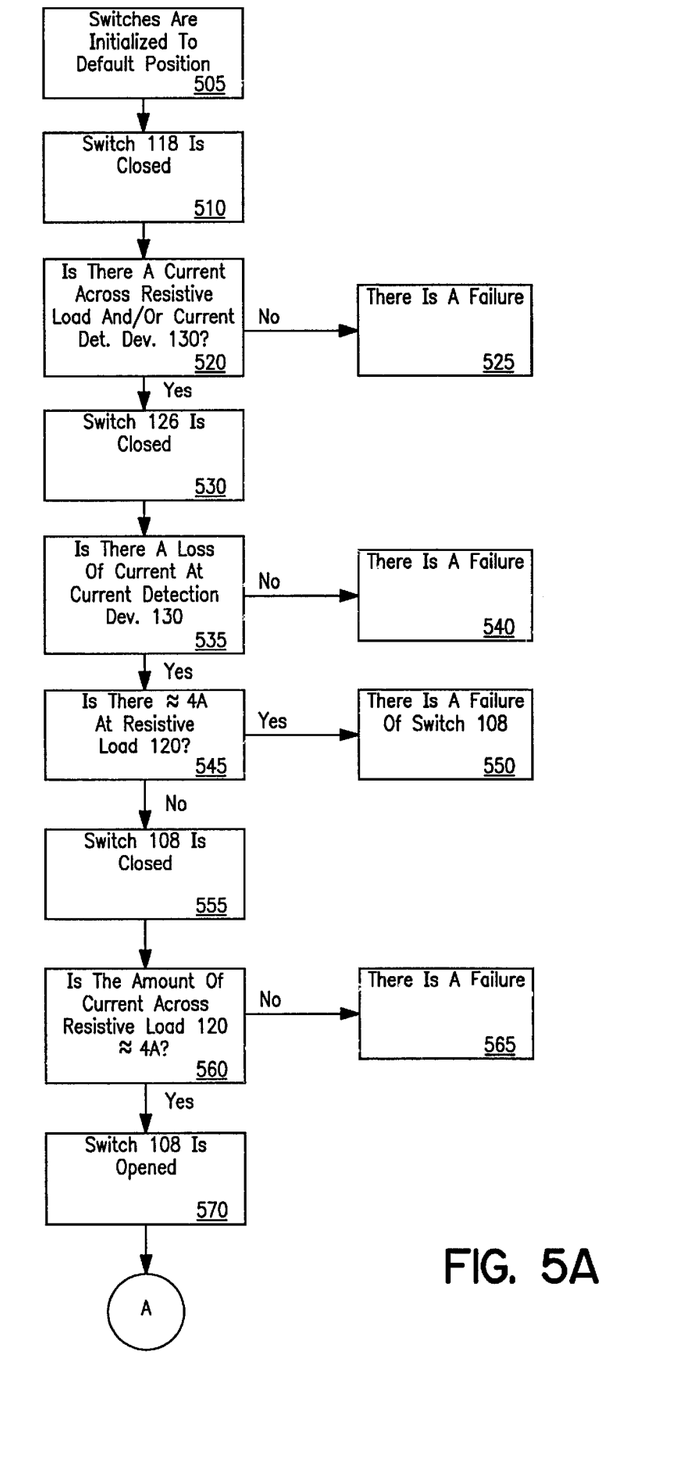
FIGS. 5A and 5B illustrate a flow diagram of the built-in testing process in accordance with an exemplary embodiment of the present invention.
Figure 5B:
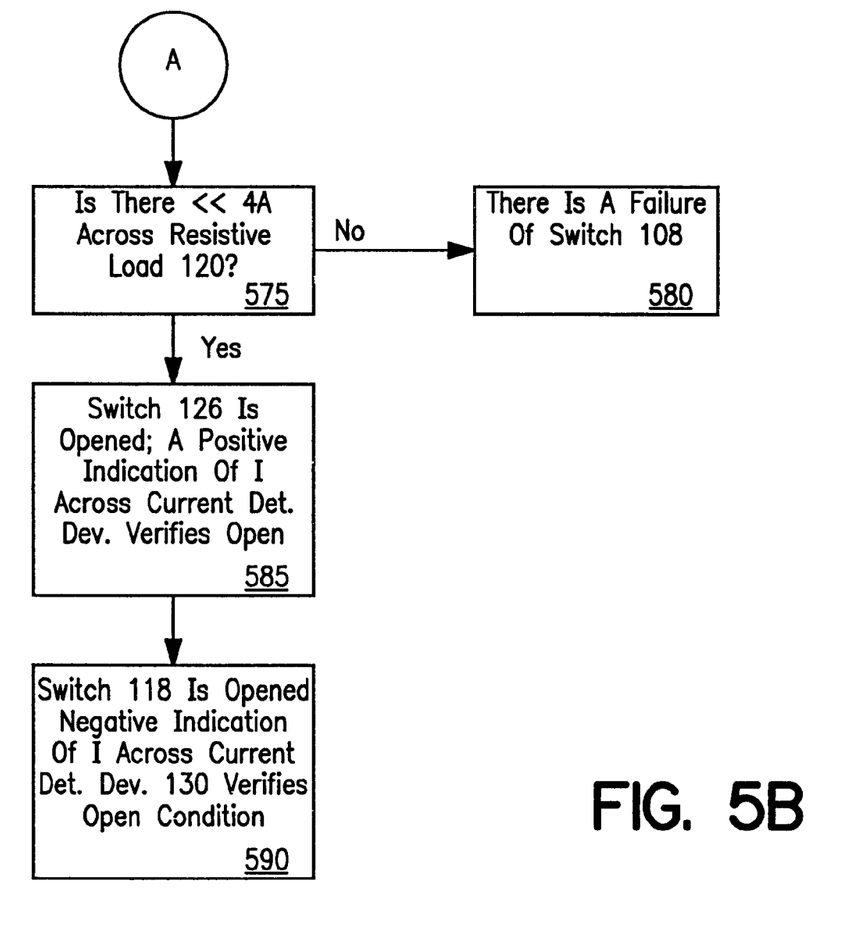

FIGS. 5A and 5B show an exemplary built-in test operation that can be performed using the system architecture of FIGS. 1–4, to ensure the ability of the squibs fire network to operate properly. The built-in test can, for example, be performed prior to an actual squib fire operation. The built-in test operation ensures that an actual squib fire current can never be supplied to a squib. However, the FIG. 1 squib fire network can verify the relatively high magnitude of an actual squib fire current using the FIG. 1 resistive load 120, without concern that a squib will inadvertently be fired. In addition, circuit continuity through each squib can be verified using a relatively low, redundantly attenuated current from voltage supply 102, without concern that a squib will inadvertently be fired.

In step 505, when a squib fire network built-in test is performed, the system starts from an initialized position. The FIG. 4 safety interlocks require switches 108, 118, 126 and switch bank 122 to all be open prior to a built-in test operation. The presence of current across the FIG. 1 resistive load 120 and/or detection of a current by the current detection device 130 denotes a switch failure.

Once an initialized position has been established, switch 118 is closed in FIG. 5A step 510. When switch 118 is closed during testing, the current magnitude is measured to determine if it is correct. When a test takes place, only the voltage supply 102 should be available to switch 118.

In FIG. 5A, step 520, the presence of an expected current magnitude through the resistive load 120 of FIG. 1 is a positive indication that the switch 118 has closed and that switch 108 is still open. The current detection device 130 provides an additional indication of the closure of switch 118. The absence of either or both indications represents a failure of the system in FIG. 5A, step 525.

If the switch 118 has closed properly, switch 126 is closed in step 530. In step 535, the current at the current detection device 130 is monitored to indicate that there was a closure of switch 126 (e.g., as indicated by a significant reduction in current magnitude to a negligible amount). In step 540, if there is not a loss of current in the current detection device 130, there is a failure of switch 126.

After having refined the operability of switches in switch 118 and switch 126, a verification that switch 108 is still open is performed. In step 545, a current across the resistive load 120 is measured. Switch 126 is closed, and current through resistive load 120 is monitored. A current measurement of approximately 4 A indicates a failure of switch 108 as shown in step 550. Otherwise, switch 108 is determined to still be properly opened.

Having verified that switch 108 is open, that all switches in switch bank 122 are open, and that switches 118 and 126 are closed, an actual squib fire current can be verified by closing switch 108 and monitoring current through resistive load 120. The high magnitude current from current source 106 is tested independently of switches in switch bank 122 to ensure that the circuit will not inadvertently apply the high current value to the squibs. Switch 108 is closed in step 555. In step 560, measurement of current through the resistive load 120 indicates, via the magnitude, whether the test has passed or failed. In an exemplary embodiment, the squib fire current is approximately 4 A. In step 565, if there is not approximately 4 A across resistive load 120 there is a failure within the system. In step 570 switch 108 is opened to remove the squib fire current.

In step 575 of FIG. 5B, after the squib fire current is removed (i.e., switch 108 is opened) the current should measure much less than the 4 A fire current. Otherwise, as shown in step 580, switch 108 has failed to open. In step 585, switch 126 is opened. Existence of current at the current detection device 130 verifies the open condition of switch 126. In step 590 of FIG. 5B, switch 118 is opened, and an absence of current at the current detection device 130 verifies the open condition of switch 118.

The current must be returned through FIG. 1 switch 126 to supply proper current through the bridge wire of a given squib. When closing switch 126, the current detection device 130 can be used to indicate an absence of current, therefore verifying the closure of switch 126. When the switch 126 is open, the current passes through current detection device 130, that can be configured with enough impedance to protect against an inadvertent activation. For example, the current detection device 130 can be in series with the current limiting resistance 128.

Each of the switches in the FIG. 1 switch bank 122 can be sequentially tested with switch 126 open. When switch 126 is open and at least one switch in switch bank 122 closed, a small amount of current should be sensed by the current detection device 130 which verifies the closure of the switch in the switch bank. Each of the selector switches in the switch bank 122 is then sequentially cycled. Switch 126 may or may not be tested with respect to each switch of the switch bank 122.

Those skilled in the art will appreciate that it is typically desired to test as many components of the squib fire network using the actual squib fire current from current source 106. However, those skilled in the art will also appreciate that with respect to any nondestructive components deemed inappropriate to conduct a test of the high current supply from current source 106 (such as any of the squibs in FIG. 1), the testing procedure can be modified accordingly. In addition, any testing of the current from current source 106 can be eliminated to shorten the testing operation if desired.

Figure 6:
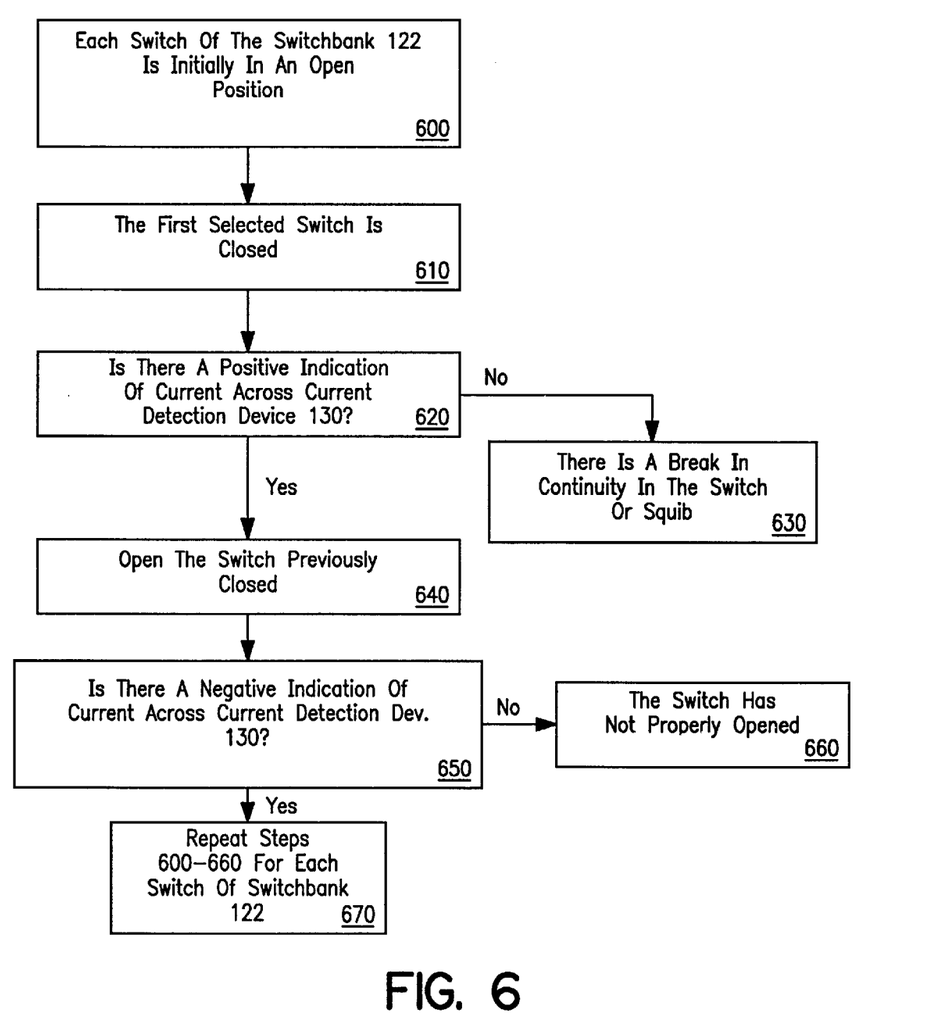
FIG. 6 illustrates a flow diagram for testing a switch bank in a built-in testing process in accordance with an exemplary embodiment of the present invention.

As illustrated in FIG. 6, the switches and squibs associated with the FIG. 1 switch bank 122 can each be tested in the following manner: In step 600, each switch of the switch bank 122 is again initialized to an open position. The first selected switch in the switch bank 122 is then closed in step 610. In step 620, the continuity of the switch and squib are verified by detection of current at the FIG. 1 current detection device 130. In step 630, if there is no indication of current through the current detection device 130, then there is a break in continuity. In step 640, the previously closed switch in the switch bank 122 is opened. In step 650, an absence of current at the current detection device 130 verifies the open condition. In step 660, if current is present, the switch has not properly opened. As shown in step 670, this process is sequentially repeated for each switch in the switch bank 122.

Figure 7:
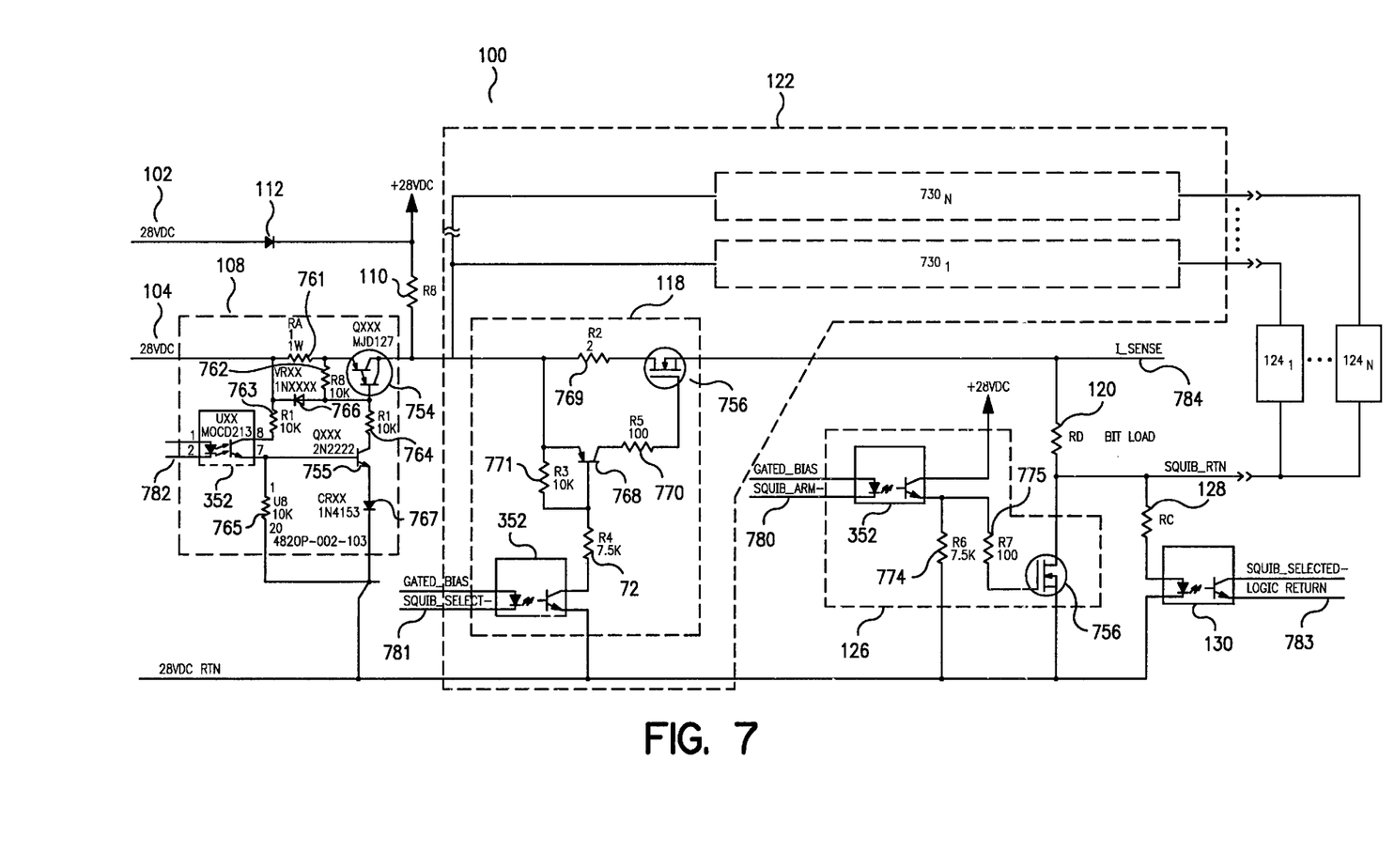
FIG. 7 illustrates a schematic diagram of a squib fire network in accordance with an exemplary embodiment of the present invention.

FIG. 7 illustrates an exemplary schematic implementation of portions of the FIG. 1 embodiment. As shown in FIG. 7, current limiting resistances 110 and 112 (the series of two or more resistance elements) are represented as a diode and a current limiting resistor. In FIG. 7, the switch 108 is represented by an opto-coupler 352 in combination with a Darlington transistor arrangement 754 and bipolar transistor 755. Various voltage dividing and current limiting resistances 761–765 are also included, as are a Zener diodes 766 and a diode 767. Switch 118 and switch 126 are each represented by an opto-coupler 352 in combination with field effect transistors (FETs) 756. Switch 118 also includes a bipolar transistor 768 and various resistors 769–772. Individual switches $730_1$ to $730_N$ of switch bank 122 can be configured identically to switch 118. In an exemplary embodiment, an individual switch $730_1$ to $730_N$ is provided for each squib $124_1$ to $124_N$. The switch 126, as shown in FIG. 7, also includes various resistors 774–775. In addition, outputs 780–782 from the logic device 114 are directed to opto-couplers 352 of each switch in the squib fire network 100 to open and close each switch. The logic device 114 also receives an output 783 from the current detection device. The microprocessor 116 in conjunction an analog-to-digital converter receives an output 784 from the resistive load 120.

The resistors used throughout the circuit can, for example, be discrete. Resistance values shown in FIG. 7 are by way of example only. It is also possible to use resistor packs (e.g., up to 15 resistors on an integrated circuit). The output of the opto-coupler 352 in switch 108 can, for example be connected to a common pin of the resistor pack. Resistor packs can be used to increase the accuracy and reduce the cost of the squib fire network. Instead of 15 or 20 discrete resistors, a resistor network can also be used which is easier to test and assemble. In addition to digital components, analog components can, of course, be used. FIG. 7 also depicts the current detection device as an optocoupler. However, those skilled in the art will appreciate that any current monitoring device can be used.

While the present invention has been described in the context of exemplary applications, those skilled in the art will appreciate that numerous variations exist. For example, while the previous embodiment has been described with respect to military applications, other applications including automobile airbags and oxygen mask ejection systems in airplanes can be employed.

While the present invention has been described with respect to its preferred embodiments, those skilled in the art will recognize that the present invention is not limited to the specific embodiments described and illustrated herein. Different embodiments and adaptations besides those shown herein and described, as well as many variations, modifications and equivalent arrangements will be apparent or reasonably suggested by the foregoing specification and drawings without departing from the substance of scope of the invention.

What is claimed is:

1. An apparatus for controlling a squib fire network, comprising:
    at least one means for supplying a current to at least one squib of said squib fire network;
    means for selecting said at least one squib to fire;
    means for testing said squib fire network, said means for testing further including;
    means for selectively gating said current to said at least one squib; and
    means to attenuate said current to a value insufficient to activate said at least one squib.

2. The apparatus of claim 1, further comprising:
    power monitor means to restrict the selective gating of said current to said at least one squib.

3. The apparatus of claim 1, wherein said means for selecting said at least one squib further comprises:
    a switch bank in operative connection with a logic device.

4. The apparatus of claim 1, wherein said at least one means for supplying a current further comprises:
    a voltage supply connected to said means to attenuate said current.

5. The apparatus of claim 1, wherein said means for selectively gating said current to said squib further comprises:
    a means for selectively gating current from said at least one squib to the at least one means for supplying a current.

6. The apparatus of claim 5, wherein said means for selectively gating current from said at least one squib further comprises:
    a switch in operative connection with a squib and a logic device.

7. The apparatus of claim 5, wherein said means for selectively gating said current to said squib further comprises:
    a switch in operative connection with a logic device, a current source and said means for selecting at least one squib.

8. The apparatus of claim 1, wherein said means to attenuate said current further comprises:
    at least two current limiting resistances.

9. The apparatus of claim 1, wherein said testing means performs testing of said squib fire network without activation of a squib in the presence of a failure in any one element of the squib fire network.

10. The apparatus of claim 1, wherein said means for supplying at least one current further comprises:
    a high value current supply means for supplying a non-attenuated current and a low value current supply means for supplying an attenuated current.

11. The apparatus of claim 10, wherein said high value current supply means is tested independent of said low value current supply means.

12. A squib fire network, comprising:
    at least one squib;
    a first switch being alternately connectable between an open condition and an output of a current source, wherein said first switch is in operative connection with at least one additional switch, said at least one additional switch being alternately connectable between an open condition and an output of said first switch, and wherein said at least one additional switch is in operative connection with said at least one squib;
    a third switch alternately connectable between an open condition and an output of said at least one squib, wherein said third switch is in operative connection with a return current line; and
    a processor operatively connected to selectively open and close each of said first switch, said at least one additional switch, and said third switch.

13. The squib fire network of claim 12, further comprising;
    a power monitor having an output which maintains at least one of said switches open.

14. The squib fire network of claim 13, wherein said power monitor ensures that control voltages for said control means are within tolerances and maintains an open condition when control voltages are not within said tolerances.

15. The squib fire network of claim 12, wherein said switches protect against inadvertent squib fire via selective opening and closing of said switches.

16. The squib fire network of claim 13, wherein said processor further comprises:
    an interlock preventing switch closure unless predefined conditions are met.

17. The squib fire network of claim 16, wherein said interlock prevents said first switch from closing unless said power monitor determines that control voltage tolerances are within predefined limits and a command has been issued from said processor.

18. The squib fire network of claim 16, wherein said interlock prevents said at least one additional switch from closing based upon a type of squib being selected.

19. The squib fire network of claim 16, wherein when a battery squib is selected for closure, said power monitor must determine that control voltages are within predefined limits, that only one of said at least one additional switches is to be closed at any time and that a command has been issued from said processor for said at least one additional switch to close.

20. The squib fire network of claim 18, wherein when a squib that is not a battery squib is selected for closure, said power monitor must determine that control voltages are within predefined limits, that only one of said at least one additional switch is to be closed at any time, that a command has been issued from said control means and either valid umbilical separation is detected and battery squibs have been activated or a voltage source is not operational.

21. The squib fire network of claim 16, wherein in order for said third switch to be closed, said power monitor must determine that control voltages are within predefined limits, that only one of said at least one additional switches is to be closed at any time and that a command has been issued from said processor.

22. An apparatus for firing a squib, comprising:
    a squib firing means, said squib firing means further including a plurality of squibs and a switch bank means;
    a current supply means for selectively providing a current supply to said squib firing means;
    switching means for selectively interrupting said current supply to said squib firing means; and
    control means to control said switch means and said switch bank means to selectively provide said current supply to a squib of said squib means.

23. The squib fire device of claim 22, wherein a sum of a squib fire current and a limited current is supplied to said squibs in a fire mode and only said limited current is supplied to said squibs in a test mode.

24. The squib fire device of claim 22, wherein said switching means further comprises a first switch for selectively providing said current supply to said squib firing means.

25. The squib fire device of claim 22, wherein said switching means further comprises a second switch for selectively returning a current on the output of said squib firing means.

26. The squib fire device of claim 23, wherein a second switching means is controlled by said control means to selectively provide said squib fire current to said squib firing means.

27. The method of claim 25, wherein said selecting step further includes:

closing at least one selected switch of a switch bank.

28. The method of claim 25, further comprising:

firing said squib by supplying a second current in addition to said first current to said squib.

29. The method of claim 25, wherein each step in the testing sequence is performed without inadvertent activation of a said squib due to a failure of a component in said squib fire network.

30. The method according to claim 28, further comprising a step of:

detecting when one of a redundant attenuators used to provide said redundant attenuation constitutes said single point failure.

31. A method for testing and firing a squib fire network, comprising the steps of:

selecting at least one squib;

supplying a first current to said at least one squib; and testing said squib fire network by selectively gating said current to said squib and attenuating said current to a value insufficient to activate said squib.

32. The method of claim 31, wherein said supplying a second current further comprises closing a first switch and second switch.

33. A method for testing operability of a squib fire network comprising the steps of:

supplying a current to at least one squib of the squib fire network; and providing redundant attenuation of said current to a value insufficient to actuate said at least one squib in the presence of a single point failure in said squib fire network.

* * * * *